United States Patent [19]

Mankins

[11] Patent Number: 4,722,209
[45] Date of Patent: Feb. 2, 1988

[54] APPARATUS AND METHOD FOR PROCESSING POWDER METALLURGY TUBING

[75] Inventor: William L. Mankins, Huntington, W. Va.

[73] Assignee: INCO Alloys International, Inc., Huntington, W. Va.

[21] Appl. No.: 850,772

[22] Filed: Apr. 11, 1986

[51] Int. Cl.[4] .............................................. B21C 37/06
[52] U.S. Cl. .......................................... 72/38; 72/370; 72/398; 72/420
[58] Field of Search ............... 419/3, 5, 28, 38, 48; 72/38, 307, 370, 193, 398, 401, 420

[56] References Cited

U.S. PATENT DOCUMENTS

| 2,780,118 | 2/1957 | Kritscher | 72/193 |
| 2,902,714 | 9/1959 | Johnson | 419/3 |
| 3,447,230 | 6/1969 | Bargainnier et al. | 419/28 |
| 4,435,359 | 3/1984 | Eiselstein et al. | 419/3 |

FOREIGN PATENT DOCUMENTS

| 959998 | 3/1957 | Fed. Rep. of Germany. |
| 1049196 | 1/1959 | Fed. Rep. of Germany. |
| 971277 | 1/1951 | France ......................... 72/398 |

*Primary Examiner*—Lowell A. Larson
*Attorney, Agent, or Firm*—Raymond J. Kenny; Edward A. Steen

[57] ABSTRACT

An apparatus (10) and method for consolidating and sintering a tube preform (12) previously fabricated by powder metallurgical techniques. A plurality of forming dies (22, 24) and movable mandrels (30, 32) cooperate to form tube consolidation zone (58,60). One-way tube gripping means (42) permit the tube (12) to progress through the apparatus (10) by the retraction of the mandrels (30, 32) while preventing the tube (12) from retreating back into the zone (58) when the mandrel (30, 32) is advanced. Heating coils (18A, 18B and 18C) heat the tube (12) to sinter it and cause it to expand clear of the mandrels (30, 32). The tube (12) is reduced in diameter and consolidated to greater than 90% theoretical density.

19 Claims, 6 Drawing Figures

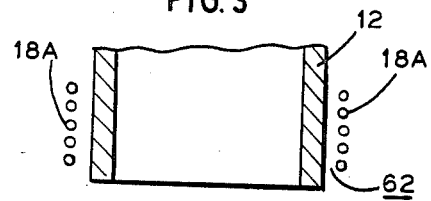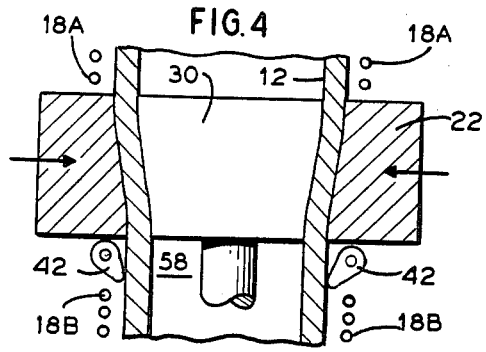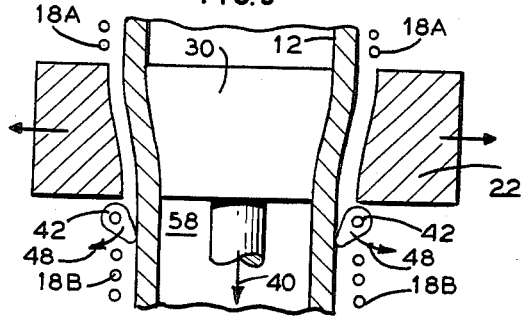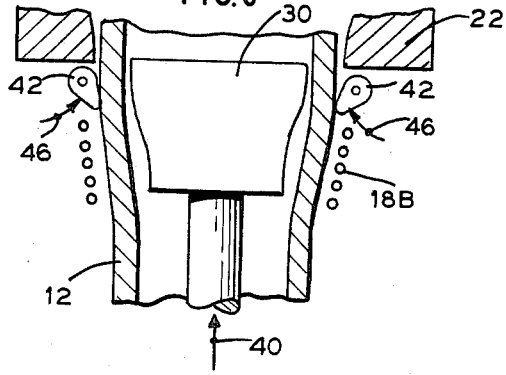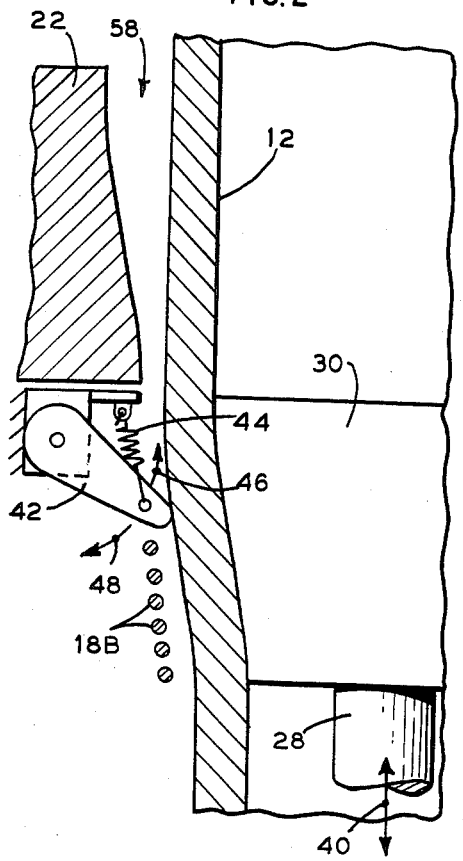

APPARATUS AND METHOD FOR PROCESSING POWDER METALLURGY TUBING

TECHNICAL FIELD

The present invention relates to powder metallurgy in general and more particularly to a powder metallurgical process and apparatus for consolidating preform tubes under a protective atmosphere.

BACKGROUND ART

In order to subsequently handle partially consolidated extruded tubes previously made by powder metallurgical processes, it has been determined that the tubular product (or preform) must be further consolidated to near theoretical density before the tube may be conventionally worked (drawn, extruded, forged, swaged, etc.). Any subsequent thermomechanical processing, such as sintering and final consolidation to higher final density, of the preform tube must be accomplished in a protective atmosphere.

Experimental work has demonstrated the need to hot work (by compression) the tubular preform while it is at the sintering temperature and under a reducing, inert, or vacuum atmosphere. This means that the furnace, hot working device and material movement equipment must all be under atmosphere. Experiments with nickel-base alloy powders, such as INCOLOY® alloy 825, have shown that such powders do not appreciably shrink during sintering. (INCOLOY is a trademark of the INCO family of companies). Moreover it is desirable that the sintering cycle be of short duration in order to conserve energy.

SUMMARY OF THE INVENTION

The instant invention relates to an apparatus and method for sintering and hot working tubular preforms under a protective atmosphere. The apparatus includes a protective enclosure that encompasses a centrally disposed reciprocating mandrel oriented between forming dies. A tube passageway is formed between the mandrel and the swaging dies. One-way tube gripping means, such as pawls, are adjacently disposed about the tube passageway. A plurality of heat sources, such as induction coils, circumscribe the tube passageway. Means are provided to reciprocate the mandrel and, as a consequence, draw the tube through the apparatus. Control means may be utilized to modulate the temperature, the rate of tube travel and the displacement of the forming dies.

BRIEF DESCRIPTION OF THE DRAWINGS

FIG. 2 is a detailed cross-sectional elevation of the drawn invention.

FIGS. 3-6 are cross-sectional elevations of the drawn invention showing sequential processing steps.

PREFERRED MODE FOR CARRYING OUT THE INVENTION

Figure 1:
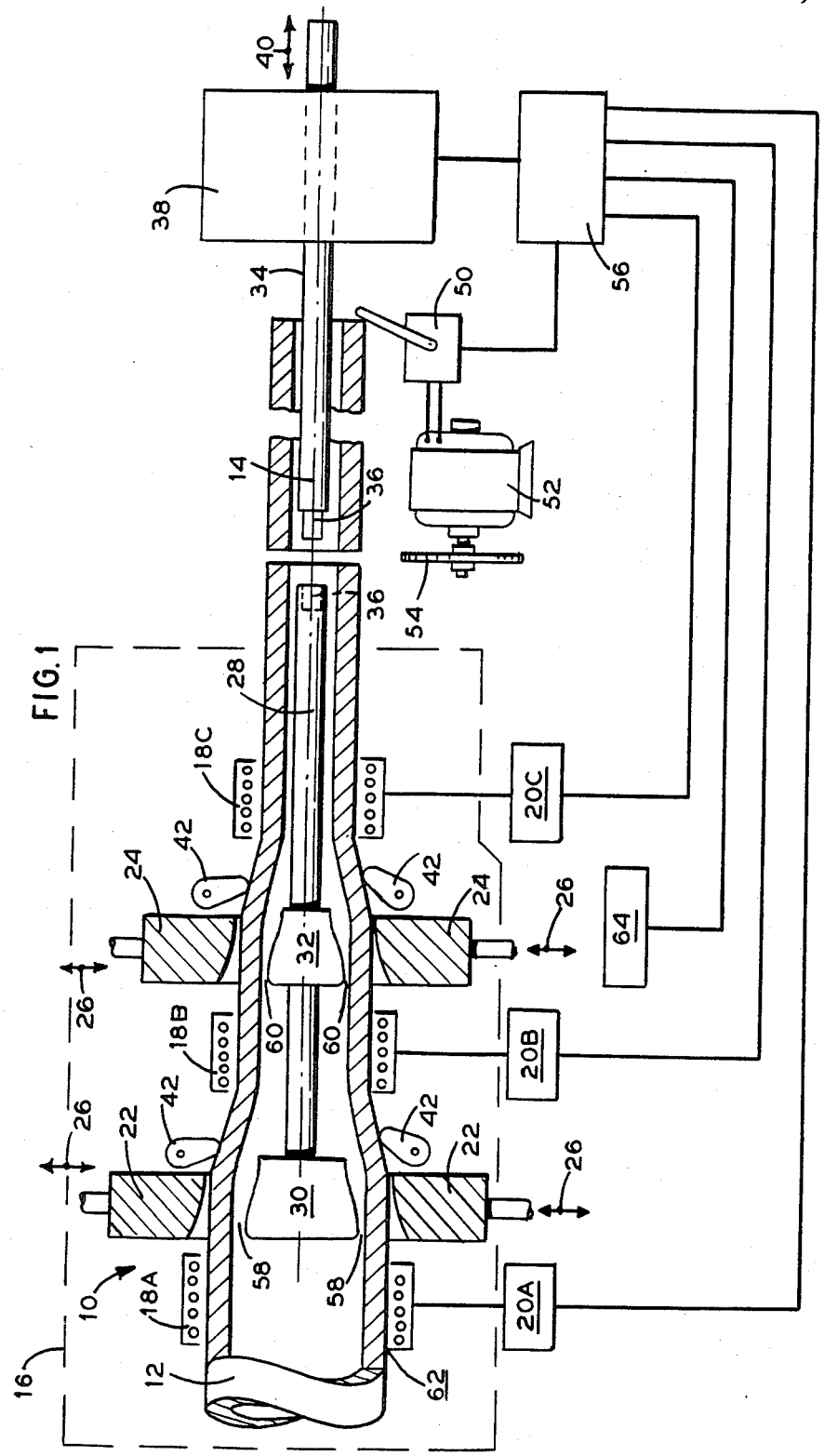
FIG. 1 is a cross-sectional elevation of an embodiment of the invention.

Referring to FIG. 1, there is shown a tube treating apparatus 10. The apparatus 10 is designed to sinter, hot work and transport a tube 12 previously fabricated by powder metallurgical ("P/M") processes. As was alluded to earlier, these tubes 12 may be, in reality, partially consolidated preforms (less than about 70% theoretical density) and must be further processed before conventional operations can be undertaken. See, for example, U.S. Pat. No. 4,435,359 for an example of one procedure for fabricating tubes from powder. The ultimate goal of the apparatus 10 is to sinter and hot work the tube 12 to densities greater than about 90% theoretical density under a protective atmosphere. In this fashion, undesirable oxidation of the tube is reduced while processing occurs.

The apparatus 10 consists of a gas tight protective housing 16. For the sake of convenience, numeral 14 depicts the axis of symmetry of the apparatus 10.

A series of heating coils 18A, 18B and 18C circumscribe the tube 12. It is preferred to use radio frequency controlled induction heating coils in order to closely control the temperature of the tube 12 as it progresses through the apparatus 10 within tube passageway 62. Controllers 20A, 20B and 20C modulate their associated coils.

A plurality of forming die sets 22 and 24 of appropriate shape are radially disposed about the tube 12. The dies 22 and 24 are movable (designated by arrows 26) in a plane substantially normal to the axis of symmetry 14. Although only a pair of dies 22 and 24 are depicted, it should be understood that a plurality of dies 22 and 24 may be radially oriented about the tube 12. Moreover, the number of die sets 22 and 24 may be increased or decreased as necessary. The illustrated dies 22 and 24 are swaging dies. However, forges, rotary forges and other compressive tools and equipment may be utilized as well.

A rod 28 is centrally located between the dies 22 and 24 within the passageway 62. The tube 12 is fitted over the rod 28. A plurality of mandrels 30 and 32, the number corresponding to the number of die sets 22 and 24, are mounted to the rod 28. The rod 28 may be affixed to member 34, by any conventional junction 36, which in turn is associated with reciprocating mechanism 38. The reciprocator 38 includes an affixing mechanism (not shown) to grasp the member 34 and cause it to be reciprocated 40 in a predetermined stroke distance substantially parallel with the axis of symmetry 14.

Disposed downstream of the die sets 22 and 24 are one-way gripping means 42. It is preferred to use pawls but other equivalent means, such as releasable collars, clamps, etc., may be employed before and after the die sets. FIG. 2 provides a detailed view of the pawls 42 located just aft of the die set 22. As above, the number of pawls 42 may be increased or decreased depending on the service conditions.

In the embodiment shown, springs 44 are employed to bias the pawl 42 in a closed position 46. Arrow 48 depicts the pawl 42 towards the open position.

Returning to FIG. 1, sensing means 50, such as a limit switch, is connected to cutting means 52, such as a blade 54 or a torch.

Control means 56, such as a microprocessor, may be employed to control the overall operation of the apparatus 10. The various sensors (not shown) provide information to the microprocessor 56 to enable it to simultaneously control the movement of the forming dies 22 and 24 via die control 64, the temperature of the coils 18A, 18B and 18C, the stroke of the central rod 28 and the operation of the cutting means 52.

The invention and manner of applying it may be better understood by a brief discussion of the principles underlying the invention.

The apparatus and method disclosed herein further consolidates and sinters seamless tubes on a continuous basis formed from metallic powders. Indeed, the invention is satisfactory for handling most metallic powder mixtures that are compactible by other methods. The invention is particularly useful for treating tubes made from ductile metal powders, such as nickel powder, cobalt powder, iron powder, copper powder, aluminum powder, magnesium powder, powders of nickel-copper alloys and powders of ductile nickel-chromium alloys, and also powders and powder mixtures of metals and alloys having suitable ductility characteristics. The metallic powder can comprise metal oxides and other metallic compounds including thorium oxide, aluminum oxide, magnesium oxide, silicon carbide, tungsten carbide, and yttrium oxide and other metallic dispersoids.

The invention is particularly useful in providing accurately dimensioned and uniformly dense tubular forms. The range of wall thicknesses which can be further consolidated satisfactorily, of course, depends somewhat on the characteristics of the powder, the preform's history, as well as the physical displacement and positioning of the dies. Moreover, the invention can be employed for production of tubes with other cross-sectional shapes, e.g., elliptical, rectangular, hexagonal and square configurations. It is to be especially noted that the invention provides for consolidation between rigid surfaces and thus enables close control over dimensional tolerances.

A tubular preform 12, consolidated to a density sufficient for handling, is inserted into the apparatus 10. A protective, non-oxidizing atmosphere (inert gases, reducing gases or vacuum) is maintained within the apparatus 10 via the enclosure 16. As the front end of the tube 12 is inserted into the tube passageway 62 and into a first tube consolidation zone 58, formed between the die set 22 and the advanced mandrel 30, it is heated by the first coils 18A to the appropriate hot working or sintering temperature of the powdered alloy. See FIG. 3. (Simply for discussion purposes, "advanced" means in the direction toward the inlet end or left side of FIG. 1 whereas "retracted" means in the direction toward the outlet end or right side of FIG. 1). The forming dies 22 compress the heated tube 12 about the mandrel 30 in the first tube consolidation zone 58, permitting the desired reduction in diameter and wall thickness. See FIG. 4. The dies 22 then release and the mandrel 30 is retracted by a predetermined stroke distance via the reciprocating mechanism 38. See FIG. 5. As the mandrel 30 is retracted, it will pull the tube 12 in the same distance as its stroke. Simultaneously, the pawls 42 will open in direction 48 allowing the just consolidated section of the tube 12 to travel with the mandrel 30.

Taking advantage of the propensity of metals to expand upon heating, the second set of coils 18B heat the upsetted section of the tube 12 to cause it to radially expand and free itself from the mandrel 30. The mandrel 30 is then advanced back into the first tube consolidation zone 58. See FIG. 6. As the now free mandrel 30 is pushed back into the consolidation zone 58, the pawls 42 will close down on the tube 12 in the direction 46, thereby preventing the tube 12 from travelling backwardly with the advancing mandrel 30. Upon return to the consolidation zone 58, the apparatus 10 is cocked to consolidate the next section of tube 12 adjacent to the just formed tube section 12.

By continuously reciprocating to and fro, and in conjunction with the gripping/releasing action of the pawls 42 and the coils 18B and 18C, the mandrel will cause the tube 12 to (1) be further consolidated and (2) travel through the apparatus 10. The coils, of course, also sinter the tube. The operation is repeated during the tube's 12 travel through the various die set stations in the apparatus 10. FIG. 1 depicts, as a non-limiting example, two swaging stations (located around the first and second tube consolidation zones 58 and 60) comprised of the swaging dies 22 and 24 and the associated mandrels 30 and 32 and coils 18A, 18B and 18C. However, it should be appreciated that the number of components and their orientation are a function of the tubes employed, the degree of consolidation desired, and their ultimate shape.

Upon egress from the apparatus 10, the consolidated tube 12 may be cut by the blade 54, if necessary. The member 34 is uncoupled from the junction 36 so that the blade 54 can pass through the tube 12. Of course, if other cutting means 52 are used, such as a torch, it may not be necessary to uncouple the member 34 from the central rod 28.

While in accordance with the provisions of the statute, there is illustrated and described herein specific embodiments of the invention, those skilled in the art will understand that changes may be made in the form of the invention covered by the claims and that certain features of the invention may sometimes be used to advantage without a corresponding use of the other features.

The embodiments of the invention in which an exclusive property or priviledge is claimed are defined as follows:

1. An apparatus for consolidating tubes previously made by powder metallurgical processes, the apparatus comprising a gas tight enclosure, an axis of symmetry, a tube passageway substantially coincident with the axis of symmetry and extending through the apparatus, at least one set of forming dies arrayed about the tube passageway, a mandrel disposed within the tube passageway and disposed in the vicinity of each die set, the mandrel movable through a reciprocal incremental stroke distance coincident with the axis of symmetry, heating means disposed about the tube passageway, the mandrel adapted to locomote a consolidated section of the tube away from the die set through the incremental stroke distance in one direction and return to the vicinity of the die set free of the tube, one-way tube gripping means disposed about the tube passageway, means for reciprocating the mandrel within the stroke distance, the mandrel and forming dies defining a consolidation zone therebetween, means for contracting and expanding the forming dies, and means for introducing and maintaining a predetermined atmosphere within the enclosure.

2. The apparatus according to claim 1 wherein a central rod is disposed within the tube passageway, the mandrel attached to the central rod.

3. The apparatus according to claim 2 wherein the rod communicates with means for urging reciprocal movement thereof.

4. The apparatus according to claim 1 wherein the one-way tube gripping means are adapted to allow the tube to travel in one selected direction while preventing tube travel in the opposite direction.

5. The apparatus according to claim 1 wherein the mandrel and one-way tube gripping means act in concert to urge the tube through the apparatus.

6. The apparatus according to claim 1 wherein the one-way tube gripping means include pawls.

7. The apparatus according to claim 1 wherein the one-way tube gripping means are disposed downstream the die set.

8. The apparatus according to claim 1 wherein the heating means are disposed adjacently to the die set.

9. The apparatus according to claim 1 wherein the heating means are induction heating coils.

10. The apparatus according to claim 1 wherein control means monitor and regulate the movement of the dies, the stroke of the mandrel, and the temperature of the coils.

11. The apparatus according to claim 1 wherein the dies and mandrel constitute a swaging set.

12. The apparatus according to claim 1 wherein an extension member is detachably coupled to the central rod, the extension member in communication with the means for reciprocating the mandrel.

13. The apparatus according to claim 1 including means for cutting the tube.

14. The apparatus according to claim 1 wherein the atmosphere within the enclosure is selected from the group consisting of a reducing gas, an inert gas and a vacuum.

15. The apparatus according to claim 1 wherein the dies and mandrel cooperate to form non-arcuate tube shapes.

16. A method for further consolidating tubes fabricated from powder metallurgy techniques to densities greater than about 90%, the method comprising:
(a) introducing the tube into a tube passageway,
(b) heating the tube,
(c) passing the tube through a tube consolidation zone consisting of a central mandrel and a plurality of forming dies,
(d) consolidating the tube within the tube consolidation zone,
(e) drawing the tube away from the tube consolidating zone by retracting the mandrel through an incremental stroke distance,
(f) heating the just consolidated portion of the tube to cause expansion thereof thus freeing the tube from the holding influence of the mandrel,
(g) advancing the mandrel back into the consolidation zone while simultaneously preventing the tube from moving, and
(h) repeating the above steps until the tube is consolidated.

17. The method according to claim 16 wherein the diameter of the tube is reduced during the consolidation step.

18. The method according to claim 16 wherein the tube is sintered during the heating step.

19. The method according to claim 16 wherein a protective atmosphere is maintained about the tube.

* * * * *